United States Patent
Steinmann et al.

(10) Patent No.: US 7,192,838 B2
(45) Date of Patent: Mar. 20, 2007

(54) METHOD OF PRODUCING COMPLEMENTARY SIGE BIPOLAR TRANSISTORS

(75) Inventors: Philipp Steinmann, Unterschleissheim (DE); Scott Balster, Munich (DE); Badih El-Kareh, Wang (DE); Thomas Scharnagl, Tiefenbach (DE)

(73) Assignee: Texas Instruments Incorporated, Dallas, TX (US)

(*) Notice: Subject to any disclaimer, the term of this patent is extended or adjusted under 35 U.S.C. 154(b) by 170 days.

(21) Appl. No.: 10/928,655

(22) Filed: Aug. 26, 2004

(65) Prior Publication Data

US 2005/0054170 A1    Mar. 10, 2005

(30) Foreign Application Priority Data

Sep. 1, 2003   (DE) ................ 103 401 82

(51) Int. Cl.
*H01L 21/331*   (2006.01)
(52) U.S. Cl. ............... 438/313; 438/317; 438/325; 438/340; 438/341; 438/342

(58) Field of Classification Search ............. 438/313
See application file for complete search history.

(56) References Cited

U.S. PATENT DOCUMENTS

| | | | | |
|---|---|---|---|---|
| 5,930,635 A | * | 7/1999 | Bashir et al. | ........... 438/313 |
| 6,856,000 B2 | * | 2/2005 | Trogolo et al. | ........... 257/518 |
| 2003/0119270 A1 | * | 6/2003 | Chen et al. | ........... 438/343 |
| 2003/0132453 A1 | | 7/2003 | Greenberg et al. | |

FOREIGN PATENT DOCUMENTS

JP         01196868 A      8/1989

* cited by examiner

*Primary Examiner*—Carl Whitehead, Jr.
*Assistant Examiner*—Colleen E. Rodgers
(74) *Attorney, Agent, or Firm*—Jacqueline J. Garner; W. James Brady, III; Frederick J Telecky, Jr.

(57) ABSTRACT

Method of producing complementary SiGe bipolar transistors. In a method of producing complementary SiGe bipolar transistors, interface oxide layers (38, 58) for NPN and PNP emitters (44, 64), are separately formed and emitter polysilicon (40, 60) is separately patterned, allowing these layers to be optimized for the respective conductivity type.

5 Claims, 6 Drawing Sheets

METHOD OF PRODUCING COMPLEMENTARY SIGE BIPOLAR TRANSISTORS

FIELD OF THE INVENTION

The present invention generally relates to the field of BiCMOS technology and, more specifically, relates to a method of producing complementary SiGe bipolar transistors.

BACKGROUND OF THE INVENTION

In a conventional process of producing complementary SiGe bipolar transistors, collector and base zones of the two conductivity types are formed in adjacent areas on a support wafer. An emitter interface oxide layer is then grown simultaneously for both transistors, and the emitters are patterned thereon. The presence of an interfacial oxide reduces the base current and increases the transistor gain. The interface oxide, however, creates a higher barrier for hole than for electron tunneling so that the NPN gain increases much more than the PNP gain. An increase in gain reduces the transistor breakdown voltage. A thickness of the interface oxide layer sufficient to improve the PNP gain causes the NPN breakdown voltage to drop below acceptable values. This can be corrected by increasing the NPN base dose, but at the cost of reducing transistor speed. An increase in base dose not only increases the Gummel number, it also reduces electron mobility, increases emitter-base capacitance, and slightly increases the base width. The net result of an increased base dose is a drop in the transient frequency (fT) by about 4 GHz.

SUMMARY OF THE INVENTION

The present invention provides a method of producing complementary SiGe bipolar transistors wherein a loss in speed is avoided.

In accordance with the invention, the method of producing complementary SiGe bipolar transistors comprises the following steps:

a support wafer is provided;

a first collector zone is formed on the support wafer in epitaxial silicon of a first conductivity type;

a second collector zone is formed on the support wafer adjacent the first collector zone in epitaxial silicon of a second conductivity type;

a first base layer is formed over the first collector zone from crystalline SiGe;

a second base layer is formed over the second collector zone from crystalline SiGe;

a continuous insulating layer is formed over the base layers;

the first base layer is selectively exposed;

a first emitter interface oxide layer optimized for the first conductivity type is deposited on the exposed first base layer;

a first emitter structure is patterned over the first interface oxide layer and the emitter structure is covered with a protective layer;

the second base layer is selectively exposed;

a second emitter interface oxide layer optimized for the second conductivity type is deposited on the exposed second base layer; and a second emitter structure is patterned over the second interface oxide layer.

By separately forming the interface oxide layers for the NPN and the PNP emitters, each of these interface oxide layers can be optimized for the respective conductivity type. As a result, a loss in speed and a deterioration of the breakdown voltage are avoided.

Further advantages and features of the invention will become apparent from the following detailed description with reference to the appending drawings.

DETAILED DESCRIPTION OF THE EMBODIMENTS

Figure 1:
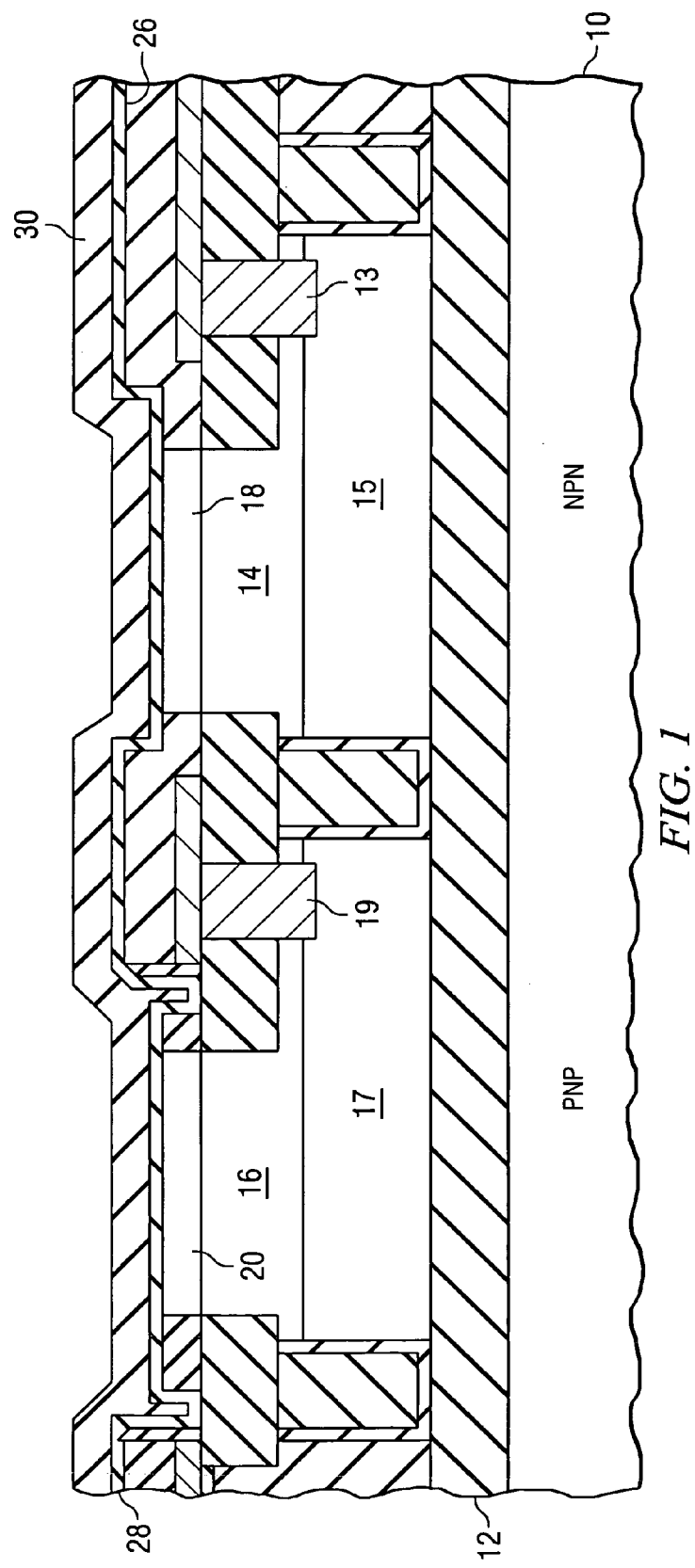
FIG. 1 is a sectional view across PNP and NPN collector and base structures on a support wafer in a condition prior to forming the NPN emitter.

With reference to FIG. 1, there is illustrated in a side view a section through a wafer 10 consisting substantially of silicon. Deposited on the wafer 10 are a few structures serving as the starting point for the method in accordance with the invention as detailed in the following. The wafer 10 comprises, running parallel to the top face, a buried layer 12 consisting of silicon dioxide, for example, and used for electrically insulating the overlying layers. Over the buried layer 12 the wafer 10 is provided with two regions, each of which is intended to form a collector zone of a bipolar transistor. In the following, the method in accordance with the invention is described for the case that in the left-hand region, termed PNP in FIG. 1, a bipolar PNP transistor is to be formed whilst in the right-hand region termed NPN in FIG. 1, a bipolar NPN transistor is to be formed.

In the NPN region the collector of an NPN transistor is formed. This zone is termed in the following NPN collector zone 14. The NPN collector zone 14 consists of an epitaxial crystalline layer of silicon. Interposed between the NPN collector region 14 and the buried layer 12 is a so-called buried n-layer 15. The buried n-layer 15 consists of silicon doped with a high concentration of n-type dopant (for example arsenic or phosphorous) to make available a low impedance contact from a contact terminal 13 to the NPN collector region 14.

In the PNP region the collector of a PNP transistor is formed. This collector zone is termed PNP collector zone 16 in the following. The PNP collector zone 16 for the PNP transistor also consists of epitaxial crystalline silicon. Interposed between the PNP collector region 16 and the buried layer 12 is a so-called buried p-layer 17. The buried p-layer 17 consists of silicon doped with a high concentration of p-type dopant (for example boron) to make available a low impedance contact from a contact terminal 19 to the PNP collector region 16.

Thereafter, a first base layer 18 is formed over the NPN collector zone 14 from crystalline SiGe. Likewise, a second base layer 20 is formed over the PNP collector zone 16 from crystalline SiGe.

After the base layers 18, 20 have been thus formed, a thin oxide film 26 is grown, covering the surface of the wafer in the current state including the base layers 18, 20. A continuous thin insulating layer 28 of tetraethylorthosilicate (TEOS) and a continuous thin nitride layer 30 are deposited over the oxide film 26.

Figure 2:
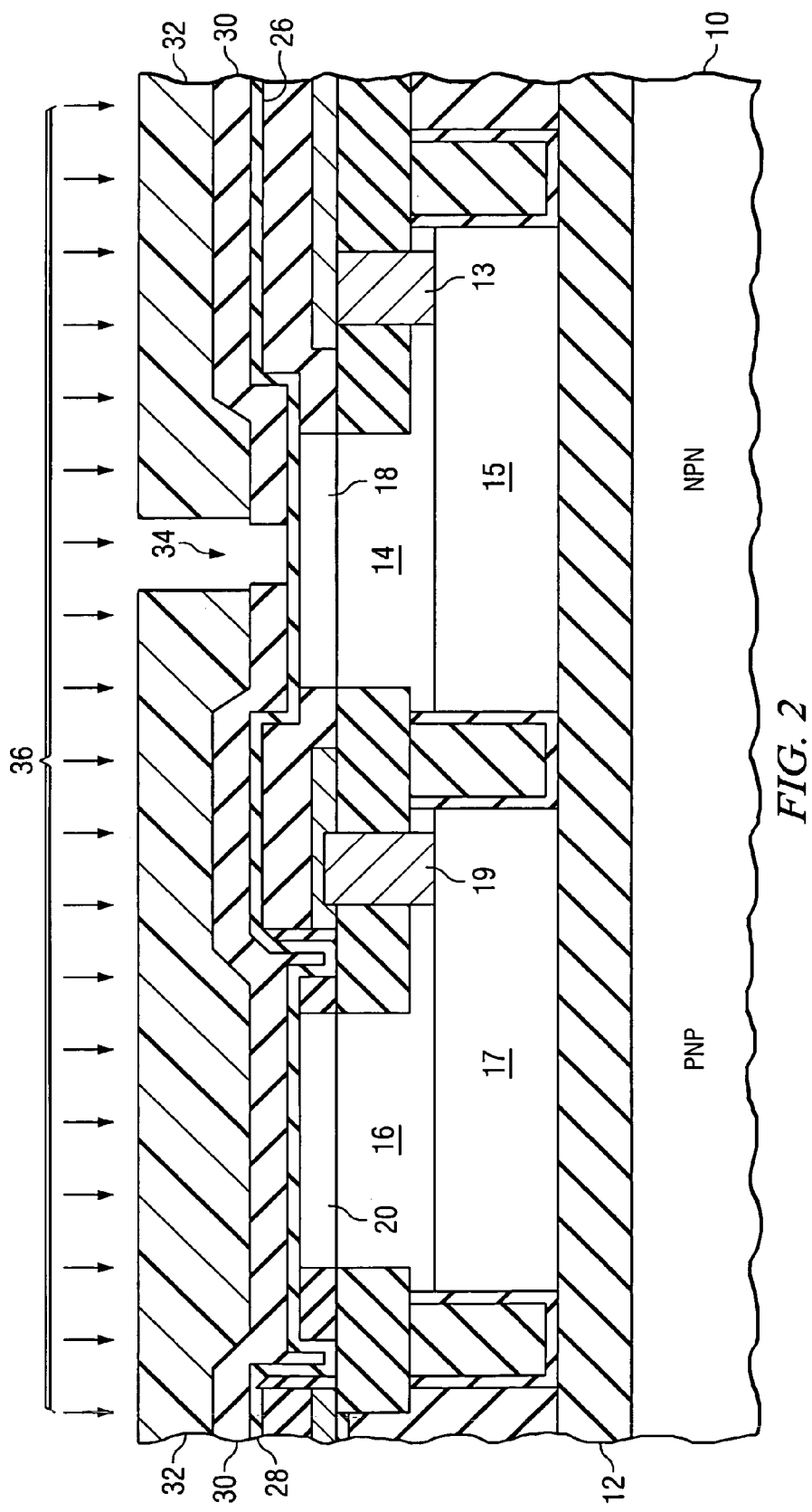
FIG. 2 is a sectional view illustrating a subsequent step of selective NPN collector ion implantation.

With reference to FIG. 2, a photoresist layer 32 is deposited and a structure is patterned therein, allowing to etch an emitter window 34 into the insulating layer, selectively exposing the first base layer 18. The NPN collector zone 14 is selectively subjected to an ion implantation through the emitter window 34, as indicated at 36.

Figure 3:
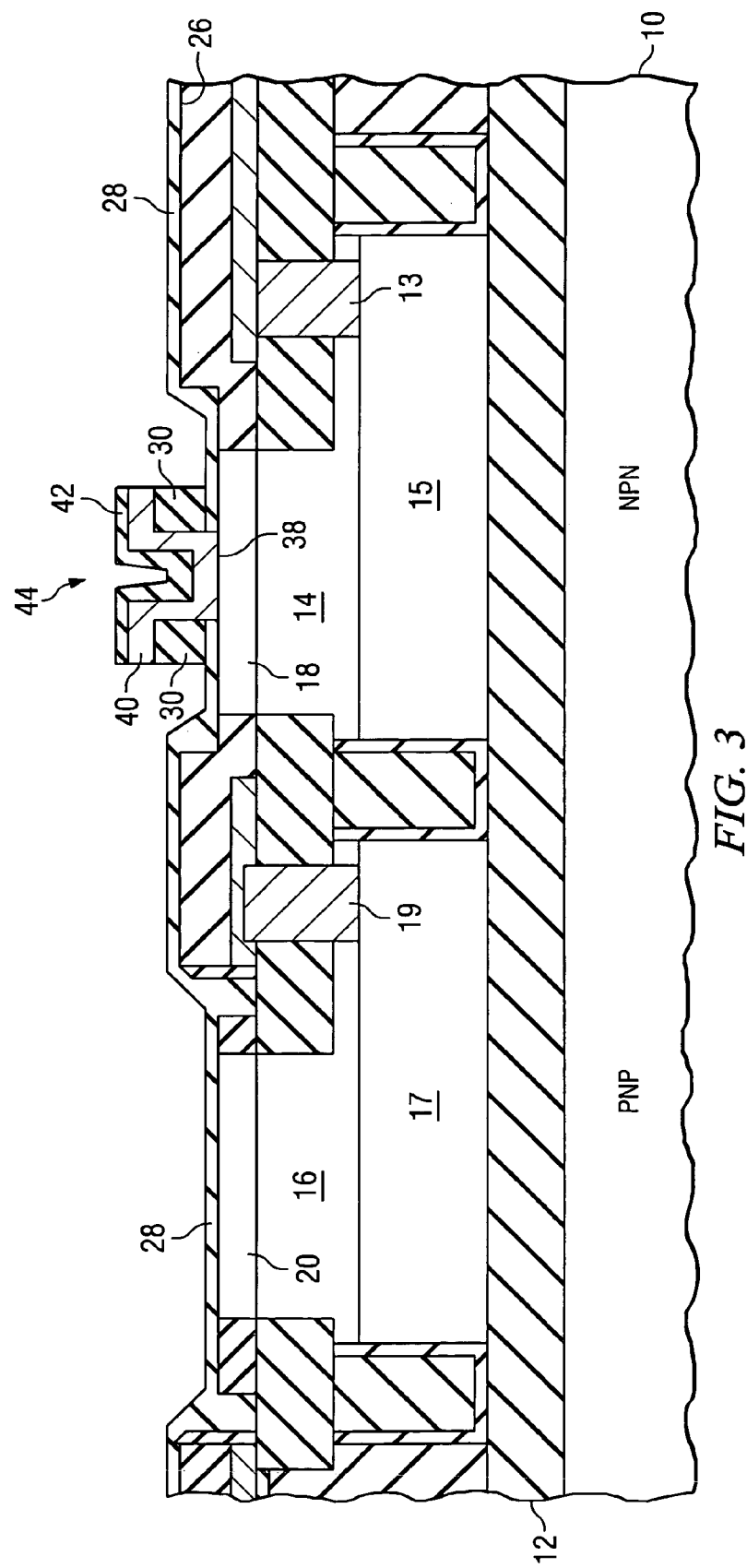
FIG. 3 is a sectional view illustrating subsequent steps of NPN emitter surface preparation, interface oxide deposition, emitter polysilicon deposition, screen oxide deposition and patterning.

Turning now to FIG. 3, a first emitter interface oxide layer (IFO) 38, optimized for the NPN conductivity type, is grown on the exposed first base layer 18. Emitter polysilicon 40 is then deposited, covered by a thin screen oxide as a protective layer 42. The emitter polysilicon 40 is blanket implanted with arsenic without a mask. Then the protective layer 42 and the emitter polysilicon 40 are patterned by etching, stopping the etching on the oxide, leaving only the NPN emitter 44 as an island. It is estimated that upon patterning of the emitter 44 a small fraction of the insulating layer 28 is removed. A thin nitride film is deposited to compensate for this removal and to protect the NPN emitter sidewalls during subsequent etches.

Figure 4:
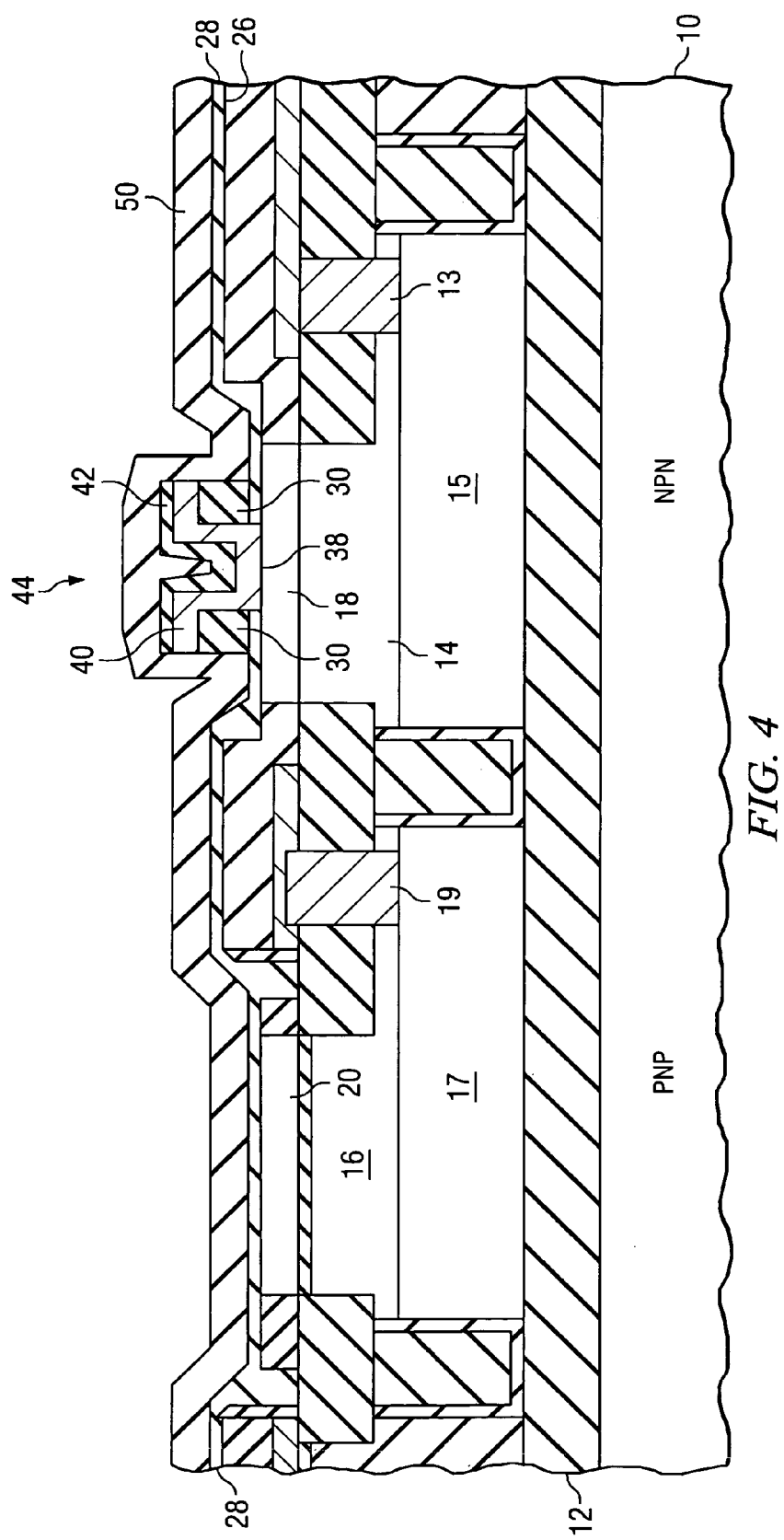
FIG. 4 is a sectional view illustrating a subsequent step of nitride deposition in preparation for the PNP emitter.
Figure 5:
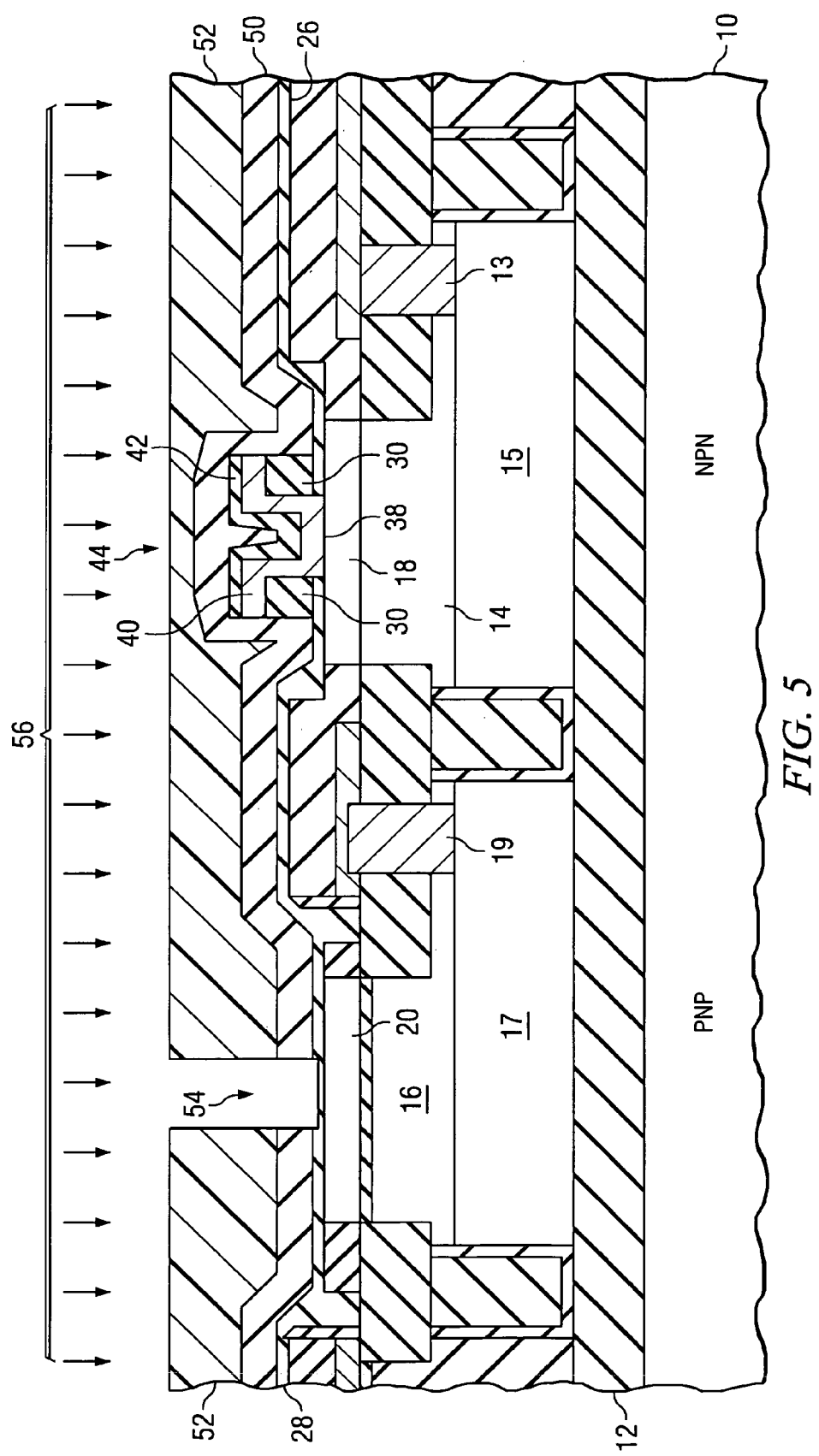
FIG. 5 is a sectional view illustrating a subsequent step of selective PNP collector ion implantation.

In a similar way, a PNP emitter is created. Specifically, with reference to FIG. 4, a second nitride film 50 is deposited, covering the entire surface of the wafer. Thereafter, a photoresist layer 52 (FIG. 5) is deposited and an emitter window 54 is opened penetrating the nitride film 50, the oxide film 26 and the insulating layer 28, selectively exposing the second base layer 20. The PNP 10 collector zone 16 is selectively subjected to an ion implantation through the emitter window 54, as indicated at 56.

Figure 6:
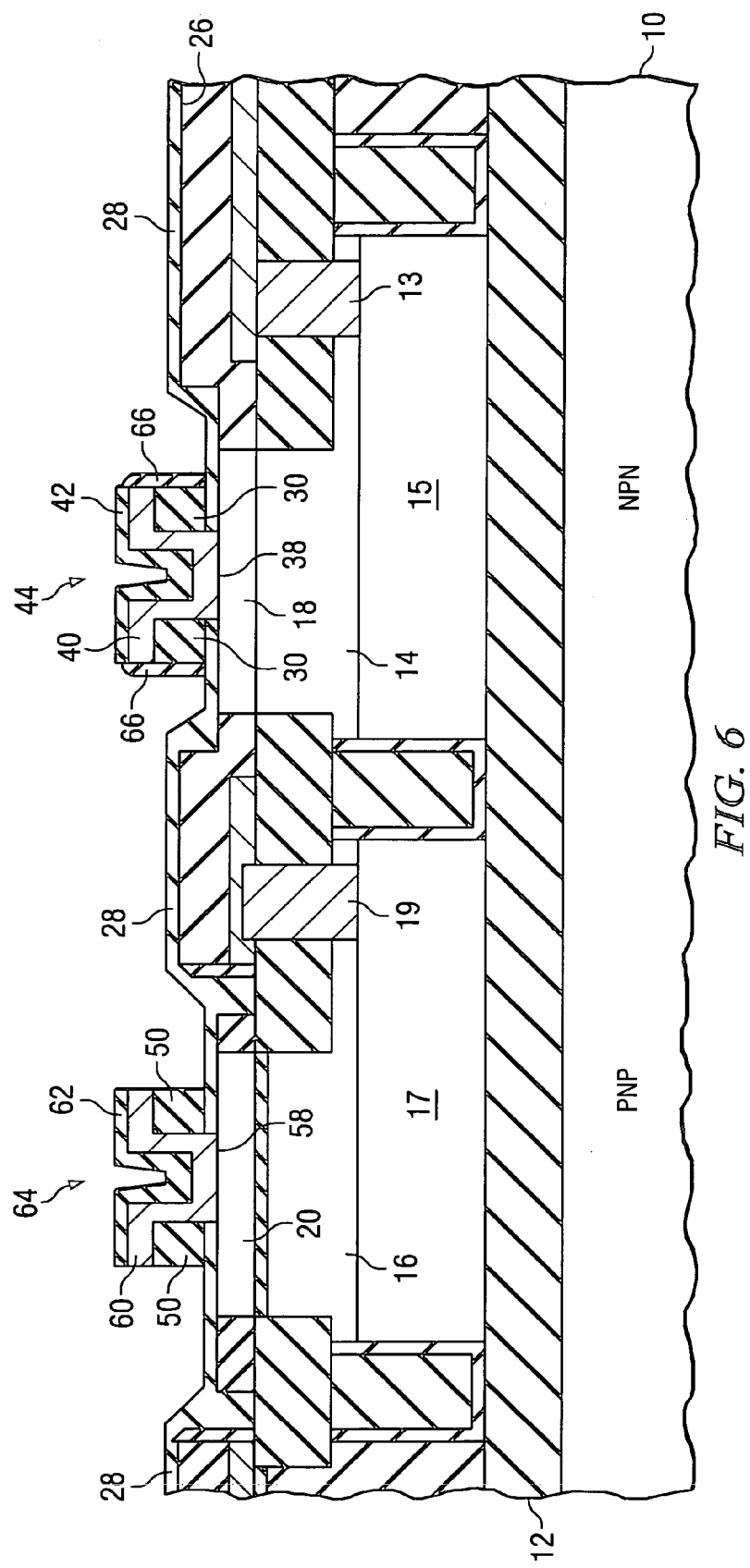
FIG. 6 is a sectional view illustrating subsequent steps of PNP surface preparation, emitter polysilicon deposition, screen oxide deposition and patterning.

After removal of the photoresist layer 52, as seen in FIG. 6, a second emitter interface oxide layer (IFO) 58, optimized for the PNP transistor, is grown, on the exposed second base layer 20. Emitter polysilicon 60 is deposited and covered by a thin screen oxide as a protective layer 62. The emitter polysilicon 60 is blanket implanted with boron without a mask. Then the protective layer 62 and the emitter polysilicon 60 are patterned by etching, stopping the etching on the underlying oxide 28, leaving only the PNP emitter 64 as an island (FIG. 6).

If any polysilicon stringers around the NPN emitter 44 are present, they can be removed by over-etching, leaving nitride spacers 66 as also shown in FIG. 6. The presence of the nitride spacers 66 reduces the aspect ratio for PNP polysilicon emitter etch and stringer removal and allows stringer removal by over-etching without attacking the NPN emitter sidewalls.

The invention claimed is:

1. A method of producing complementary SiGe bipolar transistors, comprising the steps of:
   providing a support wafer;
   forming a first collector zone on the support wafer in epitaxial silicon of a first conductivity type;
   forming a second collector zone on the support wafer adjacent the first collector zone in epitaxial silicon of a second conductivity type;
   forming a first base layer over the first collector zone from crystalline SiGe;
   forming a second base layer over the second collector zone from crystalline SiGe;
   forming an insulating layer over the base layers;
   selectively exposing the first base layer;
   depositing a first emitter interface oxide layer optimized for the first conductivity type on the exposed first base layer;
   forming a first emitter structure over the first interface oxide layer and covering the first emitter structure with a first protective layer;
   after covering the first emitter structure, selectively exposing the second base layer;
   then, depositing a second emitter interface oxide layer optimized for the second conductivity type on the exposed second base layer; and
   then, forming a second emitter structure over the second interface oxide layer.

2. The method of claim 1, wherein the second emitter structure is covered with a second protective layer.

3. The method of claim 1, wherein a continuous passivating layer is deposited over the insulating layer, a window is selectively opened in the passivating layer over the first base layer, and the first collector zone is subjected to an ion implantation.

4. The method according to claim 1, wherein a continuous passivating layer is deposited over the first emitter structure and the insulating layer, a window is selectively opened in the passivating layer over the second base layer, and the second collector zone is subjected to an ion implantation.

5. A method of fabricating a first SiGe bipolar transistor and a second SiGe bipolar transistor, comprising the steps of:
   providing a partially processed wafer comprising a first collector zone of a first conductivity type, a second collector zone of a second conductivity type, a first base layer over the first collector zone, the first base layer comprising crystalline SiGe, and a second base layer over the second collector zone, the second base layer comprising crystalline SiGe;
   forming an insulating layer over the first and second base layers;
   selectively exposing at least a portion of the first base layer without exposing the second base layer;
   forming a first emitter interface oxide layer on the exposed first base layer;
   forming a first emitter structure over the first interface oxide layer, wherein the first emitter structure, the first base layer and the first collector zone form the first SiGe bipolar transistor;
   then, selectively exposing at least a portion of the second base layer without exposing the first base layer;
   depositing a second emitter interface oxide layer on the exposed second base layer; and
   forming a second emitter structure over the second interface oxide layer, wherein the second emitter structure, the second base layer, and the second collector zone form the second SiGe bipolar transistor.

* * * * *